(12) United States Patent
Okamura et al.

(10) Patent No.: US 8,994,247 B2
(45) Date of Patent: Mar. 31, 2015

(54) PIEZOELECTRIC ACTUATOR, PIEZOELECTRIC VIBRATION APPARATUS, AND PORTABLE TERMINAL

(75) Inventors: Takeshi Okamura, Kyoto (JP); Shigenobu Nakamura, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 14/372,251

(22) PCT Filed: Aug. 31, 2012

(86) PCT No.: PCT/JP2012/072262
§ 371 (c)(1),
(2), (4) Date: Jul. 15, 2014

(87) PCT Pub. No.: WO2013/171916
PCT Pub. Date: Nov. 21, 2013

(65) Prior Publication Data
US 2015/0022058 A1    Jan. 22, 2015

(30) Foreign Application Priority Data

May 14, 2012   (JP) .................................. 2012-111026

(51) Int. Cl.
*H01L 41/047* (2006.01)
*H01L 41/09* (2006.01)
*H04R 17/00* (2006.01)

(52) U.S. Cl.
CPC ........ *H01L 41/0973* (2013.01); *H01L 41/0472* (2013.01); *H01L 41/0471* (2013.01); *H04R 17/00* (2013.01)
USPC ........................................... 310/328; 310/365

(58) Field of Classification Search
CPC .......................... H01L 41/0471; H01L 41/0472
USPC .................................................. 310/328, 365
See application file for complete search history.

(56) References Cited

U.S. PATENT DOCUMENTS

| 2001/0045792 A1 | 11/2001 | Takeshima |
| 2004/0085001 A1 | 5/2004 | Takeshima |

(Continued)

FOREIGN PATENT DOCUMENTS

| EP | 1283553 A2 | 7/2002 |
| EP | 1283553 A2 | 2/2003 |

(Continued)

OTHER PUBLICATIONS

International Search Report, PCT/JP2012/072262, Oct. 17, 2012, 2 pgs.

*Primary Examiner* — J. San Martin
(74) *Attorney, Agent, or Firm* — Volpe and Koenig, P.C.

(57) ABSTRACT

A piezoelectric actuator includes a stacked body composed of internal electrodes and piezoelectric layers which are stacked on each other; and a surface electrode disposed on at least one of main surfaces of the stacked body so as to be electrically connected to the internal electrodes. The internal electrodes each includes a first electrode and a second electrode. The stacked body has an active section in which the first electrodes and the second electrodes of the internal electrodes are arranged so as to overlap each other in a stacking direction thereof, and an inactive section which is every section of the stacked body other than the active section. An internal electrode placed on a one-main-surface side of the internal electrodes is configured so that its end part situated near a boundary between the active section and the inactive section is curved toward the other main surface.

8 Claims, 5 Drawing Sheets

(56) References Cited

U.S. PATENT DOCUMENTS

| | | |
|---|---|---|
| 2006/0138908 A1* | 6/2006 | Iwase et al. .................. 310/366 |
| 2007/0177746 A1 | 8/2007 | Kobayashi et al. |
| 2013/0135242 A1 | 5/2013 | Tsurusaki |

FOREIGN PATENT DOCUMENTS

| | | |
|---|---|---|
| JP | 06-014396 A | 1/1994 |
| JP | 06-291380 A | 10/1994 |
| JP | 07-045473 A | 2/1995 |
| JP | 7-94360 A | 4/1995 |
| JP | 9-270540 A | 10/1997 |
| JP | 2000-232027 A | 8/2000 |
| JP | 2002-010393 A | 1/2002 |
| JP | 2002-171002 A | 6/2002 |
| JP | 2003-023186 A | 1/2003 |
| JP | 2003-046154 A | 2/2003 |
| JP | 2006-238072 A | 9/2006 |
| JP | 2008-211047 A | 9/2008 |
| JP | 2009-177751 A | 8/2009 |
| JP | 2011-199206 A | 10/2011 |
| WO | 2005/004535 A1 | 1/2005 |
| WO | 2012/057214 A1 | 5/2012 |

* cited by examiner (a)

(b)

(a)

(b)

(c)

PIEZOELECTRIC ACTUATOR, PIEZOELECTRIC VIBRATION APPARATUS, AND PORTABLE TERMINAL

TECHNICAL FIELD

The present invention relates to a piezoelectric actuator which is suitable for use in a piezoelectric vibration apparatus and a portable terminal, a piezoelectric vibration apparatus, and a portable terminal.

BACKGROUND ART

As a piezoelectric actuator, as shown in FIG. 12, there is known a piezoelectric actuator employing a bimorph-type piezoelectric element 10 which is constructed by forming a surface electrode 104 on the surface of a stacked body 103 composed of internal electrodes 101 and piezoelectric layers 102 which are stacked on each other (refer to Patent Literature 1).

Moreover, there is known a construction in which a flexible substrate is joined to a main surface of a piezoelectric element by an electrically-conductive joining member, so that a surface electrode of the piezoelectric element and a wiring conductor of the flexible substrate can be electrically connected to each other (refer to Patent Literature 2).

Furthermore, there is known a piezoelectric vibration apparatus in which a midportion and one end of a bimorph-type piezoelectric element in the direction of its length are fixed to a vibrating plate (refer to Patent Literatures 3 and 4).

CITATION LIST

Patent Literature

Patent Literature 1: Japanese Unexamined Patent Publication JP-A 2002-10393
Patent Literature 2: Japanese Unexamined Patent Publication JP-A 6-14396 (1994)
Patent Literature 3: International Publication WO2005/004535
Patent Literature 4: Japanese Unexamined Patent Publication JP-A 2006-238072

SUMMARY OF INVENTION

Technical Problem

The piezoelectric actuator as shown in FIG. 12 is capable of producing flexural vibration such as a bending motion of the main surface thereof. Moreover, the piezoelectric actuator, when it is applied to a piezoelectric vibration apparatus, a portable terminal, or the like, can serve as a source of vibration for these apparatuses.

In recent years, as the desire to achieve energy saving grows, there arises an increasing demand for a piezoelectric actuator capable of affording large flexural vibration with even lower power.

The invention has been devised in view of the circumstances as mentioned supra, and accordingly an object of the invention is to provide a piezoelectric actuator capable of affording even larger flexural vibration, a piezoelectric vibration apparatus, and a portable terminal.

Solution to Problem

The invention provides a piezoelectric actuator, comprising:

a stacked body composed of internal electrodes and piezoelectric layers which are stacked on each other; and a surface electrode disposed on at least one of main surfaces of the stacked body so as to be electrically connected to the internal electrode, the internal electrodes each including a first electrode and a second electrode, the stacked body comprising an active section in which the first electrodes and the second electrodes of the internal electrodes are arranged so as to overlap each other in a stacking direction, and an inactive section which is every section of the stacked body other than the active section, an internal electrode placed on a one-main-surface side of the internal electrodes being configured so that its end part situated near a boundary between the active section and the inactive section is curved toward the other main surface.

The invention provides a piezoelectric vibration apparatus, comprising:

the piezoelectric actuator mentioned above; and
a vibrating plate joined to the other main surface of the piezoelectric actuator.

The invention provides a portable terminal, comprising:
the piezoelectric actuator mentioned above;
an electronic circuit;
a display; and
a housing,
the piezoelectric actuator being, at the other main surface thereof, joined to the display or the housing.

Advantageous Effects of Invention

According to the invention, since the end part of the internal electrode is curved, it is possible to facilitate the development of a force in a bending direction, and thus implement a piezoelectric actuator capable of affording even larger flexural vibration.

BRIEF DESCRIPTION OF DRAWINGS

FIG. 12(b) is a schematic sectional view taken along the line A-A shown in FIG. 12(a), and FIG. 12(c) is a schematic sectional view taken along the line B-B shown in FIG. 12(a).

DESCRIPTION OF EMBODIMENTS

Hereinafter, a piezoelectric actuator in accordance with one embodiment of the invention will be described in detail with reference to the drawings.

FIG. 1(a) is a schematic perspective view showing a piezoelectric actuator in accordance with one embodiment of the invention; FIG. 1(b) is a schematic sectional view taken along the line A-A shown in FIG. 1(a); and FIG. 1(c) is a schematic sectional view taken along the line B-B shown in FIG. 1(a). Moreover, FIG. 2 is a schematic sectional view taken along the line C-C shown in FIG. 1(a).

Figure 1:
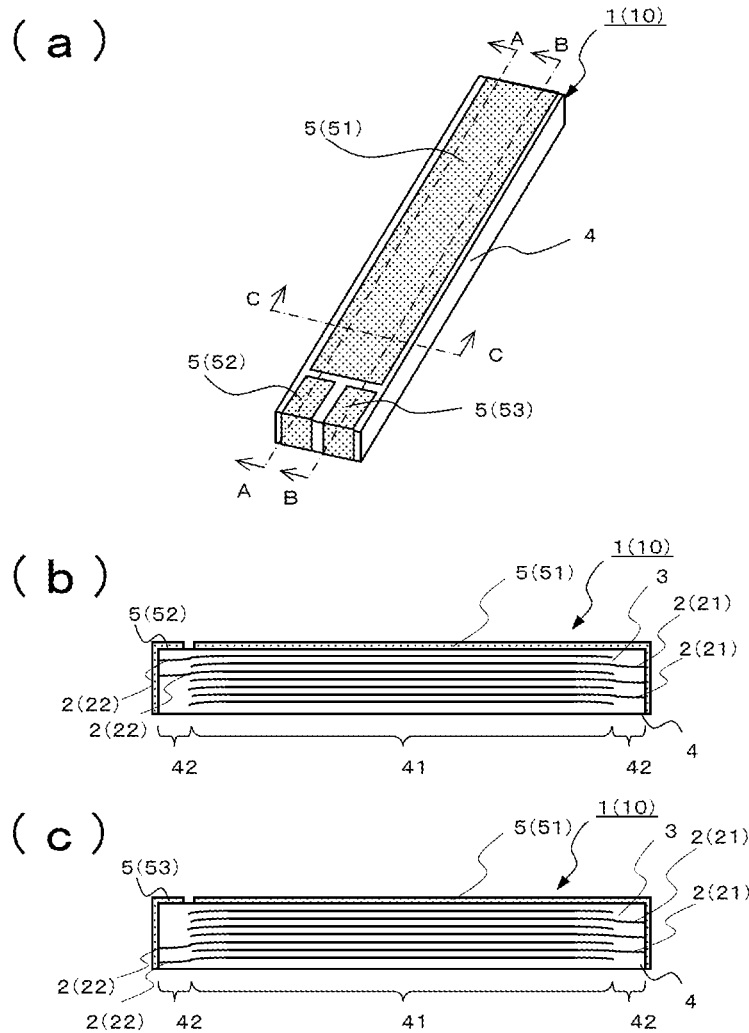
FIG. 1(a) is a schematic perspective view showing a piezoelectric actuator in accordance with one embodiment of the invention.
FIG. 1(b) is a schematic sectional view taken along the line A-A shown in FIG. 1(a)
FIG. 1(c) is a schematic sectional view taken along the line B-B shown in FIG. 1(a)
Figure 2:
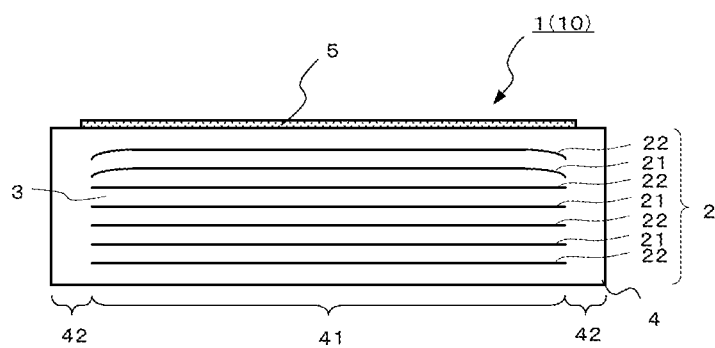
FIG. 2 is a schematic sectional view taken along the line C-C shown in FIG. 1(a)

The piezoelectric actuator 1 of the present embodiment as shown in FIG. 1 comprises: a stacked body 4 composed of internal electrodes 2 and piezoelectric layers 3 which are stacked on each other; and a surface electrode 5 disposed on at least one of main surfaces of the stacked body 4 so as to be electrically connected to the internal electrodes 2, and in this construction, the internal electrodes 2 each includes a first electrode 21 and a second electrode 22, and the stacked body 4 has an active section 41 in which the first electrodes 21 and the second electrodes 22 of the internal electrode 2 are arranged so as to overlap each other in a stacking direction, and an inactive section 42 which is every section of the staked body other than the active section 41, and, an internal electrode 2 placed on the one-main-surface side of the internal electrodes is so configured that its end part situated near the boundary between the active section 41 and the inactive section 42 is curved toward the other main surface.

The piezoelectric actuator 1 includes a piezoelectric element 10, and, the stacked body 4 constituting the piezoelectric element 10 is constructed by stacking the internal electrodes 2 and the piezoelectric layers 3 on top of each other, has the active section 41 composed of a plurality of the internal electrodes 2 arranged so as to overlap each other in the stacking direction and the inactive section 42 which is every section of the stacked body other than the active section 41, and is given an elongated form, for example. In a case where the piezoelectric actuator is attached to a display or housing of a portable terminal, the length of the stacked body 4 preferably falls in the range of, for example, 18 mm to 28 mm, and more preferably in the range of 22 mm to 25 mm. The width of the stacked body 4 preferably falls in the range of, for example, 1 mm to 6 mm, and more preferably in the range of 3 mm to 4 mm. The thickness of the stacked body 4 preferably falls in the range of, for example, 0.2 mm to 1.0 mm, and more preferably in the range of 0.4 mm to 0.8 mm.

The internal electrode 2 constituting the stacked body 4, which is formed through co-firing with ceramics used to form the piezoelectric layer 3, is composed of the first electrode 21 and the second electrode 22. For example, the first electrode 21 serves as a ground electrode, and the second electrode 22 serves as a positive or negative electrode. The internal electrodes 2 and the piezoelectric layers 3 are stacked alternately so that the piezoelectric layer 3 is sandwiched between the internal electrodes vertically, and more specifically the first electrodes 21 and the second electrodes 22 are successively arranged in the stacking order so that the piezoelectric layer 3 sandwiched between the first and second layers 21 and 22 is subjected to application of driving voltage. As the constituent material, for example, a conductor composed predominantly of silver or a silver-palladium alloy whose reactivity with piezoelectric ceramics is low, or a conductor containing copper, platinum, or the like can be used, or, alternatively, a material obtained by adding a ceramics or glass component to the aforementioned conductor can also be used.

In the embodiment as shown in FIG. 1, the end parts of the first electrodes 21 and the end parts of the second electrodes 22 are led out to the paired and opposed side surfaces of the stacked body 4 in a staggered arrangement. In the case where the piezoelectric actuator is attached to a display or housing of a portable terminal, the length of the internal electrode 2 preferably falls in the range of, for example, 17 mm to 25 mm, and more preferably in the range of 21 mm to 24 mm. The width of the internal electrode 2 preferably falls in the range of, for example, 1 mm to 5 mm, and more preferably in the range of 2 mm to 4 mm. The thickness of the internal electrode 2 preferably falls in the range of, for example, 0.1 to 5 μm.

The piezoelectric layer 3 constituting the stacked body 4 is made of ceramics having piezoelectric properties, and, as such a ceramic material, for example, a perovskite-type oxide made of lead zirconate titanate ($PbZrO_3$-$PbTiO_3$), lithium niobate ($LiNbO_3$), or lithium tantalate ($LiTaO_3$) can be used. In order to perform driving operation under low-voltage conditions, the single-layer thickness of the piezoelectric layer 3 preferably falls in the range of, for example, about 0.01 to 0.1 mm. Moreover, it is desirable to impart a piezoelectric constant $d_{31}$ of greater than or equal to 200 pm/V in the interest of acquisition of large flexural vibration.

The surface electrode 5 electrically connected to the internal electrode 2 is disposed on at least one of the main surfaces of the stacked body 4. The surface electrode 5 of the embodiment shown in FIG. 1 is composed of a first surface electrode 51 having a large area, a second surface electrode 52 having a small area, and a third surface electrode 53 having a small area. As shown in FIG. 1, for example, the first surface electrode 51 is electrically connected to the internal electrode 2 formed as the first electrode 21, the second surface electrode 52 is electrically connected to the internal electrode 2 formed as the second electrode 22 placed on the one main surface, and the third surface electrode 53 is electrically connected to the internal electrode 2 formed as the second electrode 22 placed on the other main surface. In the case where the piezoelectric actuator is attached to a display or housing of a portable terminal, the length of the first surface electrode 51 preferably falls in the range of, for example, 17 mm to 23 mm, and more preferably in the range of 19 mm to 21 mm. The width of the first surface electrode 51 preferably falls in the range of, for example, 1 mm to 5 mm, and more preferably in the range of 2 mm to 4 mm. The length of each of the second surface electrode 52 and the third surface electrode 53 preferably falls in the range of, for example, 1 mm to 3 mm. The width of each of the second surface electrode 52 and the third surface electrode 53 preferably falls in the range of, for example, 0.5 mm to 1.5 mm.

The piezoelectric actuator 1 shown in FIG. 1 is built as a so-called bimorph-type piezoelectric actuator which is, upon the input of an electric signal via the surface electrode 5, vibrated in a flexural mode so that the one main surface and the other main surface are each bent into a curved surface.

As shown in FIG. 2, in the internal electrode 2 placed on the one-main-surface side, its end part situated near the boundary between the active section 41 and the inactive section 42 is curved toward the other main surface.

According to this structure, since the end part of the internal electrode 2 is curved, it is possible to facilitate the development of a force in the bending direction during flexural behavior. This allows the piezoelectric actuator 1 to undergo even larger flexural vibration with even lower power. Moreover, as the result of more effective use of energy attributable to flexural behavior, unnecessary stress generated in the boundary between the active section 41 and the inactive section 42 of the internal electrode located near the one main surface (the boundary between the internal electrode 2 and the piezoelectric layer 3) can be lessened, wherefore occurrence of a microcrack can be suppressed, and it is thus possible to avoid a decrease in the amount of displacement resulting from quality degradation of the piezoelectric actuator 1.

As for the degree of the curve, from the viewpoint of facilitating the development of a force in the bending direction, it is advantageous that the internal electrode 2 is curved in a manner such that a line tangent to the extremity of its end part is inclined at 5° or above, and particularly 10° or above with respect to a tangential line drawn along the plane of the internal electrode 2. Note that the curved region is defined by the range from the extremity of the internal electrode 2 to a point spaced away from the extremity by a distance accounting for 10% or below of the total length of the internal electrode 2 as seen in a sectional view, and, in this region, 10 or more crystal particles of the piezoelectric layer 3 kept in contact with the internal electrode 2 are arranged contiguously from the extremity of the internal electrode 2. The effect of stress relaxation can be maximized especially when one side of the internal electrode 2 is wholly curved, and in addition, when both ends of one side thereof is curved to the greatest possible extent, the stress relaxation effect can be enhanced even further.

Figure 3:
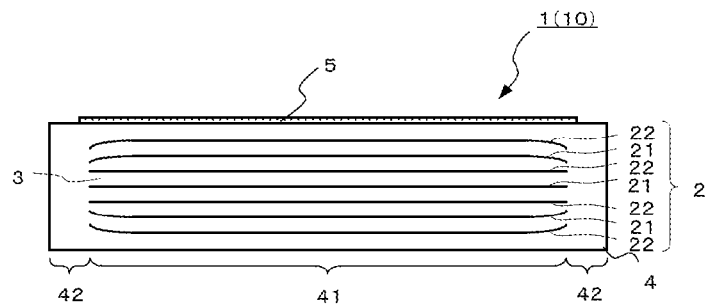
FIG. 3 is a schematic sectional view showing another example of the construction shown in FIG. 2.

Moreover, while, in FIG. 2, only the internal electrode 2 placed on the one-main-surface side is curved toward the other main surface, the internal electrode 2 placed on the other-main-surface side may also be curved toward the one main surface. For example, as shown in FIG. 3, by configuring the internal electrode 2 placed toward each of the main surfaces (the internal electrodes 2 placed on the one-main-surface side and the other-main-surface side, respectively) so that its end part situated near the boundary between the active section 41 and the inactive section 42 is curved, it is possible to facilitate the development of a force in the bending direction when the piezoelectric actuator built as a bimorph-type is bent at both main surfaces. Moreover, as the result of more effective use of energy attributable to flexural behavior, unnecessary stress generated in the boundary between the active section 41 and the inactive section 42 of the internal electrode located near each of the main surfaces (the boundary between the internal electrode 2 and the piezoelectric layer 3) can be lessened, wherefore occurrence of a microcrack can be suppressed, and it is thus possible to suppress a decrease in the amount of displacement resulting from quality degradation of the piezoelectric actuator 1.

Figure 4:
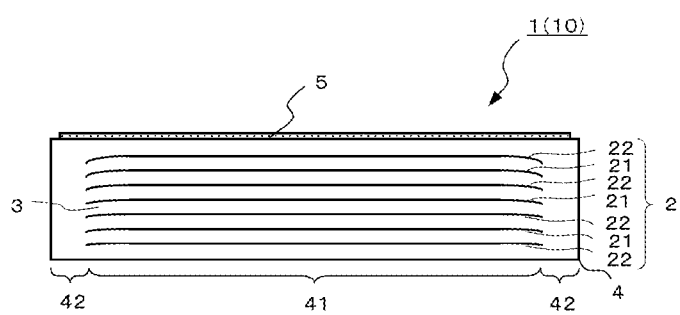
FIG. 4 is a schematic sectional view showing another example of the construction shown in FIG. 2.

Moreover, as shown in FIG. 4, all of the end parts of the internal electrode 2 situated near the boundary between the active section 41 and the inactive section 42 may be curved toward the other main surface, and, in this case, it is possible to facilitate the development of a force in the bending direction especially when a vibrating plate is joined to the other main surface. In consequence, unnecessary stress generated in the boundary between the active section 41 and the inactive section 42 of the internal electrode can be lessened, wherefore occurrence of a microcrack can be suppressed, and it is thus possible to suppress a decrease in the amount of displacement resulting from quality degradation of the piezoelectric actuator 1.

Furthermore, as shown in FIG. 4, the internal electrode 2 is preferably configured so that the degree of the curve of its end part becomes larger gradually toward the one main surface. In this structure, it is possible to facilitate the development of a force in the bending direction even further during flexural behavior, and thereby lessen the stress present in the vicinity of the end part of the internal electrode 2 where stress is applied most (the vicinity of the end part of the internal electrode 2 placed closest to the one main surface), wherefore further suppression of occurrence of a microcrack can be achieved in the boundary between the active section 41 and the inactive section 42 of the internal electrode 2 placed closest to the one main surface (the boundary between the internal electrode 2 and the piezoelectric layer 3).

Figure 5:
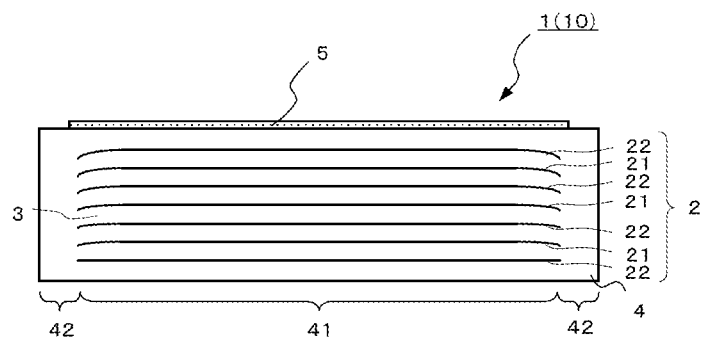
FIG. 5 is a schematic sectional view showing another example of the construction shown in FIG. 2.

On the other hand, as shown in FIG. 5, an internal electrode 2 placed closest to the other main surface of the stacked body 4 of the internal electrodes may be flat-shaped, and, in this case, when the other main surface is bonded to an object for producing vibration (such as a vibrating plate which will hereafter be described), it is likely that the construction will undergo flexural vibration together with the vibration-producing object, wherefore the efficiency of flexural vibration can be raised altogether.

Figure 6:
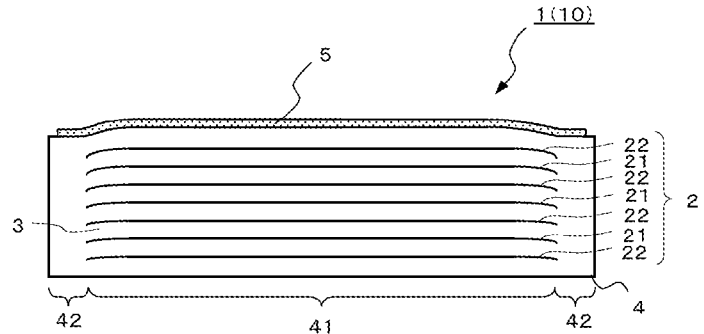
FIG. 6 is a schematic sectional view showing another example of the construction shown in FIG. 2.

Moreover, as shown in FIG. 6, where the surface electrode 5 (the first surface electrode 51) is widened so as to extend from the active section 41 toward the inactive section 42 in the width direction, it is possible to facilitate the development of a force in the bending direction even further during flexural behavior. This is because, with the provision of the structure of connection between the surface electrode 5 and the internal electrode 2 in which voltage is applied to the piezoelectric layer 3 located between the surface electrode 5 and the internal electrode 2 placed closest to the surface electrode 5, the region subjected to voltage application can be widened in, in addition to the length direction, the width direction, beyond the region of the piezoelectric layer 3 sandwiched between other internal electrodes 2: that is, it is possible to allow application of voltage also to the region of the inactive section 42, and thereby induce bending displacement effectively. In consequence, the stress generated in the boundary between the active section 41 and the inactive section 42 of the internal electrode 2 (the boundary between the internal electrode 2 and the piezoelectric layer 3) can be lessened, and also occurrence of a microcrack can be suppressed.

As shown in FIG. 6, it is more effective for the surface electrode 5 to be curved in conformity to the curve of the internal electrode 2.

Figure 7:
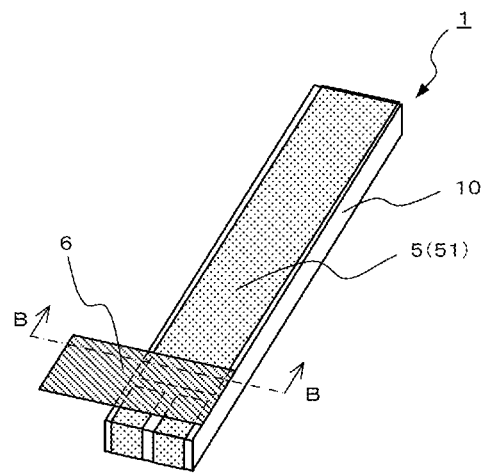
FIG. 7(a) is a schematic perspective view showing a piezoelectric actuator in accordance with another embodiment of the invention.
FIG. 7(b) is a schematic sectional view taken along the line B-B shown in FIG. 7(a)
Figure 7:
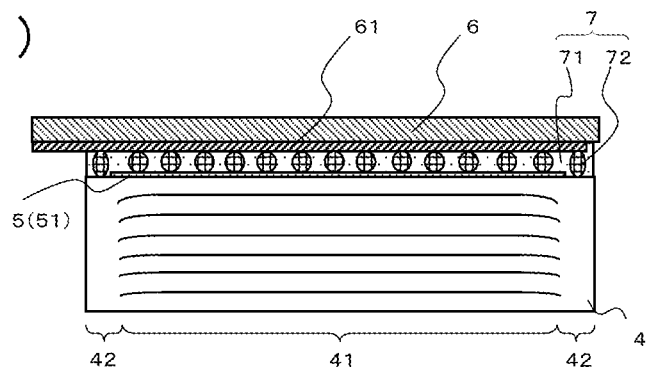

Moreover, as shown in FIG. 7, the piezoelectric actuator 1 of the invention may be designed to have a flexible substrate 6 with a wiring conductor 61, and, in this case, part of the flexible substrate 6 is advisably joined to the one main surface of the stacked body 4, so that the surface electrode 5 and the wiring conductor 61 can be electrically connected to each other via an electrically-conductive joining member 7.

The flexible substrate 6 is, for example, a flexible printed wiring board constructed by embedding two wiring conductors 61 in a resin film, one end of which is connected with a connector (not shown in the drawings) for establishing connection with an external circuit.

While an electrically-conductive adhesive, solder, or the like can be used as the electrically-conductive joining member 7, an electrically-conductive adhesive is desirable for use. This is because, with use of an electrically-conductive adhesive prepared by dispersing conductor particles 72 made of gold, copper, nickel, or gold-plated resin balls in a resin 71 such for example as acrylic resin, epoxy resin, silicone resin, polyurethane resin, or synthetic rubber, as compared with the case of using solder, vibration-induced stress can be reduced more satisfactorily. Among various electrically-conductive adhesives, an anisotropic conductive material is more desirable for use. The anisotropic conductive material is made of conductive particles responsible for electrical connection and a resin adhesive responsible for adhesion. This anisotropic conductive material, being capable of conduction in the thickness direction and capable of insulation in the in-plane direction, is free from electrical short-circuiting occurring between surface electrodes of different polarities even under narrow-pitch wiring conditions, and is thus conducive to making the part of connection with the flexible substrate 6 compact.

While the piezoelectric actuator 1 shown in FIG. 1 is a so-called bimorph-type piezoelectric actuator which is vibrated flexurally so that the one main surface and the other main surface are each bent into a curved surface upon the input of an electric signal via the surface electrode 5, the piezoelectric actuator of the invention is not limited to the bimorph-type, but may be of a unimorph-type, and, in this case, the unimorph-type piezoelectric actuator can be vibrated flexurally by joining (affixing) the other main surface of the piezoelectric actuator to a vibrating plate which will hereafter be described, for example.

Next, a method of manufacturing the piezoelectric actuator 1 of the present embodiment will be described.

The first step is to prepare ceramic green sheets for forming the piezoelectric layers 3. Specifically, calcined powder of piezoelectric ceramics, a binder made of an organic high polymer such as acrylic polymer or butyral polymer, and a plasticizer are mixed to prepare a ceramic slurry. The ceramic slurry is shaped into ceramic green sheets by a tape molding technique such as the doctor blade method or the calendar roll method. The piezoelectric ceramics may be of any given type so long as it has piezoelectric properties, and, for example, a perovskite-type oxide made of lead zirconate titanate (PbZrO3-PbTiO3) can be used. Moreover, as the plasticizer, dibutyl phthalate (DBP), dioctyl phthalate (DOP), or the like can be used.

Next step is to prepare an electrically-conductive paste for forming the internal electrode 2. Specifically, the electrically-conductive paste is prepared by admixing a binder and a plasticizer in metal powder of a silver-palladium alloy. This electrically-conductive paste is applied, in an internal-electrode 2 pattern, onto the above-described ceramic green sheets by screen printing technique. Then, a plurality of the ceramic green sheets with the printed electrically-conductive paste are stacked on top of each other, and, the resultant is subjected to debinding, or binder removal treatment at a predetermined temperature, is fired at a temperature of 900 to 1200° C., and is ground into a predetermined configuration by means of a surface grinder or otherwise, whereby the stacked body 4 composed of internal electrodes 2 and piezoelectric layers 3 which are alternately staked on each other can be produced.

In such a manufacturing process, after a plurality of the ceramic green sheets with the printed electrically-conductive paste are stacked on top of each other, for example, with use of a metal mold or resin mold having a recess as an upper mold (one main surface-sided mold) of a press apparatus, and a metal mold or resin mold of flat form as a lower mold (the other main surface-sided mold) of the press apparatus, the piezoelectric actuator 1 having the configuration as shown in FIG. 6 can be produced.

It is noted that the way of producing the stacked body 4 is not limited to the method thus far described, and the stacked body 4 can therefore be produced by any given production method so long as it allows formation of a stacked body 4 composed of a plurality of internal electrodes 2 and piezoelectric layers 3 which are stacked on each other.

After that, the surface electrode 5 is formed by printing an electrically-conductive paste containing silver and glass, which is prepared by adding a binder, a plasticizer, and a solvent to a mixture of glass and conductive particles composed predominantly of silver, to the main and side surfaces of the stacked body 4 in a surface-electrode 5 pattern by means of screen printing technique or otherwise, performing drying process, and performing baking process at a temperature of 650 to 750° C.

In a case where the surface electrode 5 is electrically connected to the internal electrode 2, the production can be carried out by any given method, such for example as a method of forming a via-hole passing through the piezoelectric layer 3 for the electrical connection, or a method of forming a side electrode on the side surface of the stacked body 4.

Next, the flexible substrate 6 is fixedly connected (joined) to the piezoelectric element 10 with use of the electrically-conductive joining member 7.

The first step is to apply a paste for forming the electrically-conductive joining member to a predetermined location of the piezoelectric element 10 by using the screen printing technique, etc. Subsequently, the electrically-conductive joining member-forming paste is cured, with the flexible substrate 6 maintained in contact therewith, whereby the flexible substrate 6 can be fixedly connected to the piezoelectric element 10. Note that the paste for forming the electrically-conductive joining member may be applied on the flexible-substrate 6 side.

In cases where the electrically-conductive joining member 7 is an electrically-conductive adhesive, and the resin constituting the electrically-conductive adhesive is a thermoplastic resin, after the electrically-conductive adhesive is applied to a predetermined location of the piezoelectric element 10 or the flexible substrate 6, the piezoelectric element 10 and the flexible substrate in a state of being in contact with each other through the electrically-conductive adhesive are subjected to application of heat and pressure, thereby softening and fluidizing the thermoplastic resin, whereafter the temperature is returned to a room-temperature level to cure the thermoplastic resin once again, with the consequence that the flexible substrate 6 is fixedly connected to the piezoelectric element 10.

Especially when an anisotropic conductive member is used for the electrically-conductive joining member 7, there is a need to control the amount of applied pressure in a manner to avoid contact between conductive particles proximate to each other.

Moreover, while the above description deals with the method of applying the electrically-conductive adhesive on the piezoelectric element 10 or the flexible substrate 6, it is possible to use an electrically-conductive adhesive in sheet form, and, in this case, the piezoelectric element 10 and the flexible substrate 6 in a state of having the sheet sandwiched therebetween are subjected to application of heat and pressure for mutual joining.

Figure 8:
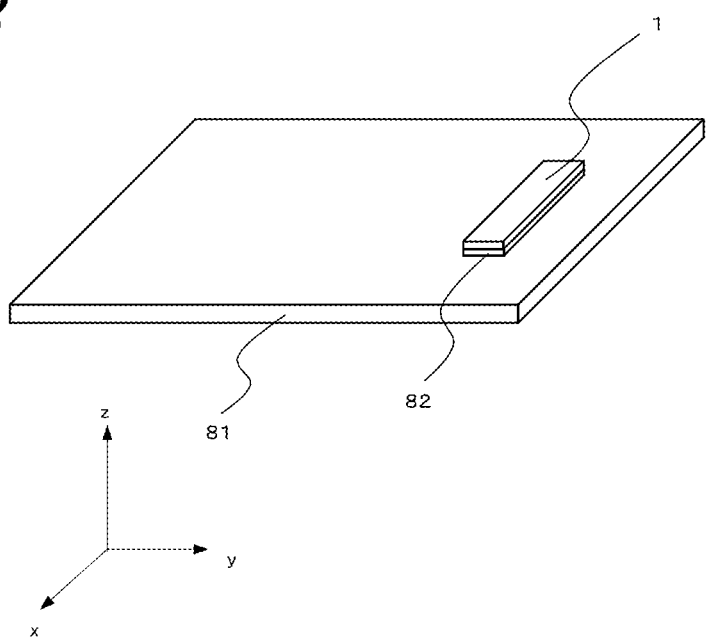
FIG. 8 is a schematic perspective view schematically showing a piezoelectric vibration apparatus in accordance with an embodiment of the invention.

As shown in FIG. 8, a piezoelectric vibration apparatus pursuant to the invention comprises the piezoelectric actuator 1, and a vibrating plate 81 attached to the other main surface of the piezoelectric actuator 1.

The vibrating plate 81 is shaped like a rectangular thin plate. The vibrating plate 81 can be formed with proper use of a material having high rigidity and great elasticity such as acrylic resin or glass. The thickness of the vibrating plate 81 is set to fall in the range of, for example, 0.4 mm to 1.5 mm.

The vibrating plate 81 is attached, through a joining member 82, to the other main surface of the piezoelectric actuator 1. The other main surface of the piezoelectric actuator 1 may be entirely joined to the vibrating plate 81 through the joining member 82, or may be substantially entirely joined to the vibrating plate 81 through the joining member 82.

The joining member 82 is shaped like a film. Moreover, the joining member 82 is made of a material which is softer and more deformable than the vibrating plate 81, and is thus smaller than the vibrating plate 81 in respect of coefficient of elasticity and rigidity, such as Young's modulus, modulus of rigidity, and modulus of volume elasticity. That is, the joining member 82 is deformable, and, when equal force is applied to the joining member 82 and the vibrating plate 81, the joining member 82 becomes deformed more greatly than the vibrating plate 81. The other main surface (the main surface pointing in the −z direction in the drawing) of the piezoelectric actuator 1 is entirely fixed to one main surface (the main surface pointing in the +z direction in the drawing) of the joining member 82, and part of one main surface (the main surface pointing in the +z direction in the drawing) of the vibrating plate 81 is fixed to the other main surface (the main surface pointing in the −z direction in the drawing) of the joining member 82.

The joining member 82 may be of a one-piece member, or may be of a composite body consisting of several members. As such a joining member 82, for example, a double-faced tape formed by applying an adhesive to both sides of abase material made of a nonwoven fabric or the like, or a variety of elastic adhesives that are adhesives having elasticity are suitable for use. Moreover, although the thickness of the joining member 82 is preferably greater than the amplitude of flexural vibration of the piezoelectric actuator 1, a too-large thickness will cause attenuation of vibration, wherefore the thickness is set to fall in the range of 0.1 mm to 0.6 mm, for example. However, in the piezoelectric vibration apparatus of the invention, there is no particular limitation to the material used for the joining member 82, wherefore the joining member 82 may be made of a material which is harder and less deformable than the vibrating plate 81. Moreover, in some instances, a structure having no joining member 82 may be adopted.

The thusly constructed piezoelectric vibration apparatus of the present embodiment functions as a piezoelectric vibration apparatus for vibrating the vibrating plate 81 by imparting flexural vibration to the piezoelectric actuator 1 through the application of an electric signal. Note that, for example, the vibrating plate 81 may be supported, at its other end in the length direction (the end pointing in the −y direction in the drawing) or at its edge, by a non-illustrated supporting member.

Moreover, in the piezoelectric vibration apparatus of the present embodiment, the vibrating plate 81 is joined to the flat other main surface of the piezoelectric actuator 1. Thus, the piezoelectric vibration apparatus in which the piezoelectric actuator 1 and the vibrating plate 81 are firmly joined to each other can be obtained.

Figure 9:
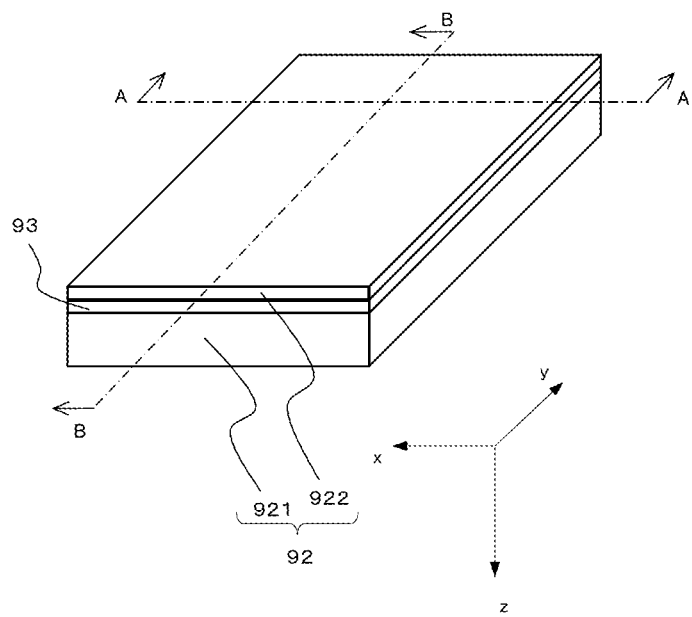
FIG. 9 is a schematic perspective view schematically showing a portable terminal in accordance with an embodiment of the invention.
Figure 10:
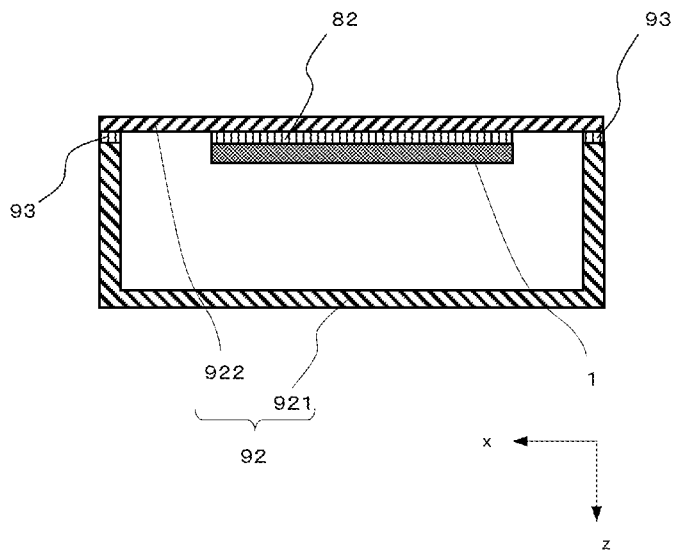
FIG. 10 is a schematic sectional view taken along the line A-A shown in FIG. 9.
Figure 11:
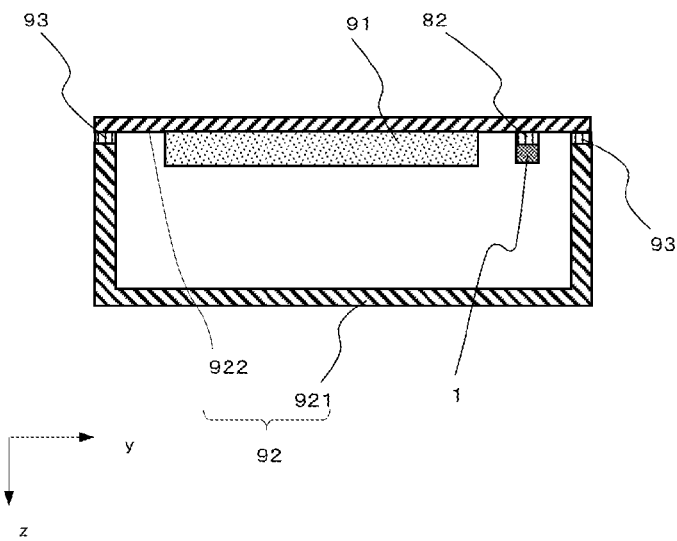
FIG. 11 is a schematic sectional view taken along the line B-B shown in FIG. 9.
Figure 12:
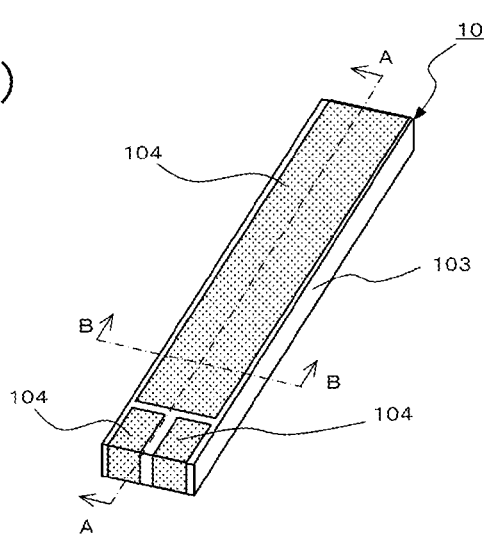
FIG. 12 is a schematic perspective view showing one example of a conventional piezoelectric actuator.
Figure 12:
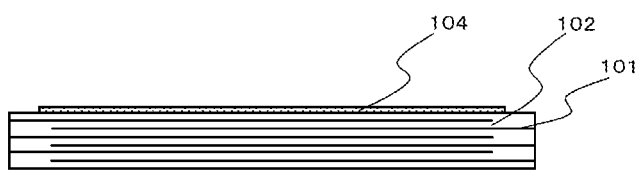
Figure 12:
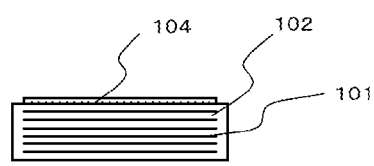

As shown in FIGS. 9 to 11, a portable terminal pursuant to the invention comprises: the piezoelectric actuator 1; an electronic circuit (not shown in the drawings); a display 91; and a housing 92, and, in this construction, the other main surface of the piezoelectric actuator 1 is joined to the housing 92. FIG. 9 is a schematic perspective view schematically showing the portable terminal of the invention, FIG. 10 is a schematic sectional view taken along the line A-A shown in FIG. 9, and FIG. 11 is a schematic sectional view taken along the line B-B shown in FIG. 9.

It is preferable that the piezoelectric actuator 1 and the housing 92 are joined to each other with use of a deformable joining member. That is, in FIGS. 10 and 11, the joining member 82 is a deformable joining member.

In the case where the piezoelectric actuator 1 and the housing 92 are joined to each other by the deformable joining member 82, upon transmission of vibration from the piezoelectric actuator 1, the deformable joining member 82 becomes deformed more greatly than the housing 92.

At this time, antiphase vibration reflected from the housing 92 can be lessened by the deformable joining member 82, wherefore strong vibration can be transmitted to the housing 92 from the piezoelectric actuator 1 without the influence of ambient vibration.

The joining member 82 is desirable to be at least partly made of a viscoelastic body from a point of view that, while strong vibration from the piezoelectric actuator 1 can be transmitted to the housing 92, weak vibration reflected from the housing 92 can be absorbed by the joining member 82. For example, a double-faced tape formed by applying an adhesive to both sides of a base material made of a nonwoven fabric or the like, or a joining member which includes an adhesive having elasticity, and more specifically those having a thickness of 10 μm to 2000 μm, can be used.

In the present embodiment, the piezoelectric actuator 1 is attached to part of the housing 92 serving as a cover for the display 91, and this part of the housing 92 functions as a vibrating plate 922.

While the present embodiment has been described with respect to the case where the piezoelectric actuator 1 is joined to the housing 92, the piezoelectric actuator 1 may be joined to the display 91.

The housing 92 comprises a box-shaped housing main body 921 with its one surface opened, and the vibrating plate 922 which blocks the opening of the housing main body 921. The housing 92 (the housing main body 921 and the vibrating plate 922) can be formed with proper use of a material having high rigidity and great elasticity such as synthetic resin.

The edge of the vibrating plate 922 is attached to the housing main body 921 through a joining member 93 so as to be able to vibrate. The joining member 93 is made of a material which is softer and more deformable than the vibrating plate 922, and is thus smaller than the vibrating plate 922 in respect of coefficient of elasticity and rigidity, such as Young's modulus, modulus of rigidity, and modulus of volume elasticity. That is, the joining member 93 is deformable, and, when equal force is applied to the joining member 93 and the vibrating plate 922, the joining member 93 becomes deformed more greatly than the vibrating plate 922.

The joining member 93 may be of a one-piece member, or may be of a composite body consisting of several members. As such a joining member 93, for example, a double-faced tape formed by applying an adhesive to both sides of abase material made of a nonwoven fabric or the like is suitable for use. The thickness of the joining member 93 is adjusted so as to avoid attenuation of vibration ascribable to too large a thickness, and is thus set to fall in the range of 0.1 mm to 0.6 mm, for example. However, in the portable terminal of the invention, there is no particular limitation to the material used for the joining member 93, wherefore the joining member 93 may be made of a material which is harder and less deformable than the vibrating plate 922. Moreover, in some instances, a structure having no joining member 93 may be adopted.

Examples of the electronic circuit (not shown) can be a circuit for processing image information to be shown on the display 91 and sound information to be transmitted by the portable terminal, a communication circuit, and so forth. The electronic circuit may be of at least one of the aforementioned circuits, or may include all of these circuits. Moreover, the electronic circuit may be of a circuit having different capability. Furthermore, a plurality of electronic circuits may be provided. The electronic circuit is connected to the piezoelectric actuator 1 by means of non-illustrated connection wiring.

The display 91 is a display device having the function of showing image information, and, a heretofore known display such for example as a liquid crystal display, a plasma display, or an organic EL display is suitable for use as the display 91. Note that the display 91 may be designed to have an input device such as a touch panel. Moreover, the cover (vibrating plate 922) for the display 91 may be designed to have an input device such as a touch panel. Furthermore, the display 91 may be, in its entirety or in part, designed to function as a vibrating plate.

Moreover, the portable terminal of the invention is characterized in that the display 91 or the housing 92 produces vibration to transmit sound information through ear cartilage or by air conduction. The portable terminal of the present embodiment is capable of effecting transmission of sound information by transmitting vibration to ear cartilage through the direct contact of the vibrating plate (the display 91 or the housing 92) with the ear or the contact of the vibrating plate with the ear through other object. That is, transmission of sound information can be achieved by transmitting vibration to ear cartilage through the direct or indirect contact of the vibrating plate (the display 91 or the housing 92) with the ear. Thus, for example, a portable terminal capable of sound information transmission even in a noisy environment can be obtained. Note that the object to be interposed between the vibrating plate (the display 91 or the housing 92) and the ear may be any given object so long as it is capable of transmission of vibration, for example, it may be a cover for the portable terminal, headphones, earphones, and so forth. Moreover, the portable terminal may be designed to transmit sound information by causing sound produced from the vibrating plate (the display 91 or the housing 92) to propagate through the air. Furthermore, the portable terminal may be designed to transmit sound information via a plurality of routes.

The portable terminal of the present embodiment transmits sound information by means of the piezoelectric actuator 1 capable of effective vibration production, and is thus capable of transmission of high-quality sound information.

EXAMPLES

Next, concrete examples of the piezoelectric vibration apparatus of the invention will be described. A piezoelectric vibration apparatus which employs a piezoelectric actuator as shown in FIG. 6 was produced for characteristics measurement.

The piezoelectric actuator has an elongated form which is 23.5 mm in length, 3.3 mm in width, and 0.5 mm in thickness. Moreover, the piezoelectric actuator has a structure composed of 30 μm-thick piezoelectric layers and internal electrodes which are alternately stacked on each other, and the total number of the piezoelectric layers is 16. The piezoelectric layer was made of lead zirconate titanate in which Sb was substituted in part for Zr.

Then, in order to curve the internal electrode, after ceramic green sheets with printed electrically-conductive paste were stacked on top of each other, with use of a resin mold having a recess as an upper mold (a mold to be contacted by one main surface) of a press apparatus, and a flat mold as a lower mold (a mold to be contacted by the other main surface) of the press apparatus, the piezoelectric actuator having the configuration as shown in FIG. 6 was produced.

The surface electrode was printed to be longer than the internal electrode in a manner such that each end of the surface electrode in the width direction is spaced by a distance of 1 mm from each end of the internal electrode.

In the piezoelectric actuator, the amount of protrusion of the midportion of one main surface relative to the ends thereof in the +z direction in the drawing was equal to 10% of the thickness of the piezoelectric actuator (0.05 mm). Moreover, the other main surface of the piezoelectric actuator was found to be substantially flat.

Then, a glass plate was bonded to a metal-made frame by a double-faced tape, and the other main surface of the piezoelectric actuator was bonded in the center of one surface of the glass plate by double-faced tape, and, a microphone was set at a position spaced 1 mm away from the other surface of the glass plate.

Subsequently, sinusoidal signals of an effective value 3.0 V have been inputted to the piezoelectric actuator while varying the signal frequency within the range of 0.3 to 3.4 kHz, and, sound pressure detected by the microphone was measured. In addition, sinusoidal signals have been applied continuously in 100,000 cycles to make comparison between the sound pressure levels before and after the continuous measurement.

The result showed that, in each case, high sound-pressure characteristics were attained even under low-input conditions. Thus, the invention has proven itself in usefulness.

REFERENCE SIGNS LIST

1: Piezoelectric actuator
10: Piezoelectric element
2: Internal electrode
21: First electrode
22: Second electrode
3: Piezoelectric layer
4: Stacked body
41: Active section
42: Inactive section
5: Surface electrode
51: First surface electrode
52: Second surface electrode
53: Third surface electrode
6: Flexible substrate
61: Wiring conductor
7: Electrically-conductive joining member
71: Resin
72: Conductor particle
81: Vibrating plate
82: Joining member
91: Display
92: Housing
921: Housing main body
922: Vibrating plate
93: Joining member

The invention claimed is:

1. A piezoelectric actuator, comprising:
a stacked body having a longitudinal direction and a width direction, the stacked body composed of internal electrodes and piezoelectric layers which are stacked on each other; and
a surface electrode disposed on at least one of main surfaces orthogonal to a stacking direction of the stacked body so as to be electrically connected to the internal electrodes,
the internal electrodes each including a first electrode and a second electrode,
the stacked body comprising an active section in which the first electrodes and the second electrodes of the internal electrodes are arranged so as to overlap each other in a stacking direction thereof, and an inactive section which is every section of the stacked body other than the active section,
an internal electrode placed on a one-main-surface side of the internal electrodes being configured so that its end part situated near a boundary between the active section and the inactive section is curved toward the other main surface,
the surface electrode being disposed to extend from the active section to the inactive section in the longitudinal direction and the width direction, the surface electrode being curved in conformity to the curve of the internal electrode in the width direction.

2. The piezoelectric actuator according to claim 1,
wherein the internal electrode placed on the one-main-surface side is configured so that a degree of the curve of its end part becomes larger gradually toward the one main surface.

3. The piezoelectric actuator according to claim 1,
wherein an internal electrode placed closest to the other main surface of the stacked body of the internal electrodes is flat-shaped.

4. The piezoelectric actuator according to claim 1, further comprising:
a flexible substrate having a wiring conductor,
wherein part of the flexible substrate is joined to the one main surface of the stacked body so that the surface electrode and the wiring conductor are electrically connected to each other via an electrically-conductive joining member.

5. A piezoelectric vibration apparatus, comprising:
the piezoelectric actuator according to claim 1; and
a vibrating plate joined to the other main surface of the stacked body.

6. The piezoelectric vibration apparatus according to claim 5,
wherein the piezoelectric actuator and the vibrating plate are joined to each other by a deformable joining member.

7. A portable terminal, comprising:
the piezoelectric actuator according to claim 1;
an electronic circuit;
a display; and
a housing,
the piezoelectric actuator being, at the other main surface of the stacked body, joined to the display or the housing.

8. The portable terminal according to claim 7,
wherein the piezoelectric actuator and the display or the housing are joined to each other by a deformable joining member.

* * * * *